US007023130B2

(12) United States Patent
Haoto

(10) Patent No.: US 7,023,130 B2
(45) Date of Patent: Apr. 4, 2006

(54) ELECTRODE FOR ELECTROLUMINESCENCE AND ELECTROLUMINESCENT DEVICE USING THE SAME

(75) Inventor: Daisaku Haoto, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 266 days.

(21) Appl. No.: 10/394,997

(22) Filed: Mar. 24, 2003

(65) Prior Publication Data

US 2004/0082250 A1 Apr. 29, 2004

(30) Foreign Application Priority Data

Mar. 25, 2002 (JP) ............................ 2002-082826

(51) Int. Cl.
*H05B 33/00* (2006.01)

(52) U.S. Cl. ...................................... 313/503; 313/498

(58) Field of Classification Search ........ 313/503–505; 428/690

See application file for complete search history.

(56) References Cited

U.S. PATENT DOCUMENTS 5,429,884 A * 7/1995 Namiki et al. .............. 428/690
6,140,763 A * 10/2000 Hung et al. ................. 313/503

FOREIGN PATENT DOCUMENTS

JP 03112088 * 5/1991

* cited by examiner

*Primary Examiner*—Joseph Williams
(74) *Attorney, Agent, or Firm*—Oliff & Berridge, PLC

(57) ABSTRACT

The present invention provides an electrode for electroluminescence for use in electronic devices including organic electroluminescent devices and a process for producing the same, in which interfacial electric characteristics, such as work functions, can be easily controlled. The process for producing an electrode for electroluminescence comprises the step of diffusing an additive element for an electrode into the electrode and/or the step of developing surfactant properties of the additive element for an electrode.

5 Claims, No Drawings

ELECTRODE FOR ELECTROLUMINESCENCE AND ELECTROLUMINESCENT DEVICE USING THE SAME

TECHNICAL FIELD

The present invention relates to an electrode, for electroluminescence, having controlled interfacial electric characteristics and a process for producing the same. More particularly, the present invention relates to an electrode for electroluminescence for use in various electronic devices including organic electroluminescent devices and a process for producing the same.

BACKGROUND ART

In the electroluminescence industry, what has hitherto been demanded is the control of interfacial electric characteristics of electrodes for electroluminescence. Interfacial electric characteristics of electrodes, such as work function, affect the efficiency of charge injection into a luminescent layer and greatly influence luminescence efficiency. For this reason, an attempt has hitherto been made to control the relationship between work functions of electrode materials. In this case, a complicated process, for example, involving intentional provision of interlayer materials has been adopted rather than the adoption of control utilizing diffusion and surfactant properties. The provision of very thinly controlled layers of these materials, however, disadvantageously complicates the production process and increases the production cost.

DISCLOSURE OF THE INVENTION

An object of the present invention is to provide an electrode for electroluminescence which can easily control interfacial electric characteristics such as work functions and a process for producing the same and particularly to provide an electrode for electroluminescence for use in electronic devices including organic electroluminescent devices and a process for producing the same.

With a view to attaining the above object, the present inventor has made intensive and extensive studies and, as a result, has found that the interfacial electric characteristics, such as work functions, of an electrode for electroluminescence can be easily controlled by migration-depositing, in an island form or in a layer form, an additive element for an electrode, for example, tin (Sn), antimony (Sb), lithium (Li), or cesium (Cs), on the surface of the electrode for electroluminescence through the utilization of diffusion and/or surfactant effect of the additive element through grain boundaries of the electrode for electroluminescence and, further, optionally surface modifying the electrode. This has led to the completion of the present invention.

Thus, according to one aspect of the present invention, there is provided a process for producing an electrode for electroluminescence, comprising the step of diffusing an additive element for an electrode into the electrode and/or developing surfactant properties of the additive element.

BEST MODE FOR CARRYING OUT THE INVENTION

Step of Diffusion and Step of Developing Surfactant Properties

An electrode, particularly an electrode formed by a vacuum thin film formation method has the following features. Specifically, in this electrode, grain boundaries are likely to be formed within the electrode. When a metal is present within the electrode or at the interface of the substrate and the electrode, the metal migrates through the grain boundaries to the surface of the electrode and is deposited on the outermost surface of the electrode. Examples of such phenomena include diffusion, that is, a phenomenon wherein the material migrates from a higher material concentration site to a lower material concentration site to homogenize the material concentration, and surfactant effect, that is, a phenomenon wherein, when a material B is deposited on a surface formed of a material A, which is different from the material B, the material A migrates through the material B, deposited on the material A, to the surface of the material B to form a surface formed of the material A. The migration-deposited metal grains of the same type are likely to aggregate together.

According to the present invention, an electrode for electroluminescence having controlled interfacial electric characteristics, such as a controlled work function of the surface, is provided by controlling the migration-depositing of an element (an additive element for an electrode) onto the surface of the electrode through the utilization of these properties and optionally conducting post-treatment. The control of the work function of the surface of the electrode for electroluminescence by this method can advantageously simplify the production process and can reduce the cost.

The development of the above diffusion effect and surfactant effect can be accelerated by the application of various types of energy. Examples of energy usable herein include those obtained by heat (preferably at 200° C. or above) irradiation, ultrasonic wave irradiation, electromagnetic wave irradiation, plasma irradiation, and ion irradiation.

Additive Element for Electrode

The additive element for an electrode used in the present invention is not limited so far as the additive element can develop the diffusion effect and/or surfactant effect in the electrode for electroluminescence and the additive element or a compound of the additive element, such as an oxide of the additive element, can change the interfacial electric characteristics of the surface of the electrode for electroluminescence.

Regarding such additive elements for an electrode, examples of additive elements usable for an anode include elements having a larger work function than the anode or hole-rich oxides. Examples of additive elements usable for a cathode include elements having a smaller work function than the cathode or electron-rich oxides, and elements which can be converted to nitrides.

Specific examples of additive elements usable for the formation of the anode include tin (Sn), antimony (Sb), gold (Au), cobalt (Co), iridium (Ir), osmium (Os), palladium (Pd), platinum (Pt), tungsten (W), arsenic (As), nickel (Ni), copper (Cu), iron (Fe), bismuth (Bi), praseodymium (Pr), and thallium (Tl). Specific examples of additive elements usable for the formation of the cathode include cerium (Ce), rubidium (Rb), cesium (Cs), lithium (Li), sodium (Na), calcium (Ca), magnesium (Mg), europium (Eu), erbium (Er), ytterbium (Yb), yttrium (Y), barium (Ba), strontium (Sr), zirconium (Zr), and titanium (Ti).

The above elements may be used for the formation of the electrode by various methods. Examples of methods usable herein include: the incorporation of the additive element as a component of the material for the electrode for electroluminescence; the formation of the electrode for electroluminescence on a layer of the additive element; and the formation of a layer of the additive element on the electrode for electroluminescence. Methods usable for the formation of the layer of the additive element for the electrode include sputtering, ion plating, vapor deposition, CVD, and MBE.

When the electrode for electroluminescence is a transparent electrode and, at the same time, when a layer of the additive element for the electrode is provided, what is required of the layer of the additive element is not to sacrifice the transparency of the electrode for electroluminescence. Specifically, for example, the layer of the additive element preferably has a light (for example, 550 nm light) transmittance of not less than 80%.

Electrode for Electroluminescence

The electrode for electroluminescence according to the present invention comprises an electrode for electroluminescence and, provided on the electrode, a layer containing an additive element for the electrode. The layer containing an additive element for the electrode is not limited so far as the layer has been formed by the step of diffusion and/or the step of developing surfactant properties.

Materials of electrodes for electroluminescence include, for example, ITO and platinum (Pt).

In an embodiment of the electrode for electroluminescence according to the present invention, the additive element for an electrode is present within the electrode and on one side (lower layer) of the electrode, and the concentration of the additive element in the surface of the electrode is higher than that of the additive element within the electrode.

When the electrode for electroluminescence according to the present invention is used as an anode, preferably, a layer containing an additive element for an electrode having a larger work function than the anode is provided on the anode. On the other hand, when the electrode for electroluminescence according to the present invention is used as a cathode, preferably, a layer containing an additive element for an electrode having a smaller work function than the cathode is provided on the cathode.

The cathode electrode is transparent as viewed from the cathode side and has rectification capability.

In the formation of the electrode for electroluminescence according to the present invention, conventional methods may be used, and examples thereof include sputtering, ion plating, and vapor deposition.

Post-Treatment of Electrode for Electroluminescence

In the electrode for electroluminescence according to the present invention, if necessary, after the migration-depositing of the additive element for an electrode, post-treatment, such as the formation of a compound of the additive element or surface conditioning, may be carried out.

Examples of preferred post-treatment usable herein include oxygen plasma treatment, chlorine plasma treatment, nitrogen plasma treatment, ammonia plasma treatment, fluorine plasma treatment, UV treatment, ozone treatment, and heat annealing treatment.

More specifically, in the anode, when platinum, antimony, gold, tin, nickel, copper, iron, bismuth, praseodynium, thallium, etc. are used as the additive element for the electrode, oxygen plasma treatment may be mentioned as preferred post-treatment; and when antimony and iron are used as the additive element for the electrode, chlorine plasma treatment is preferred as the post-treatment. On the other hand, in the cathode, when barium, calcium, strontium, yttrium, etc. are used as the additive element for the electrode, oxygen plasma treatment is preferred as the post-treatment; when zirconium, titanium, etc. are used as the additive element for the electrode, nitrogen plasma treatment or ammonia plasma treatment is preferred as the post-treatment; and when lithium etc. is used as the additive element for the electrode, fluorine plasma treatment is preferred as the post-treatment.

Where Electrode for Electroluminescence is ITO

In a preferred embodiment of the present invention, the electrode for electroluminescence is an ITO electrode.

In this case, specifically, for example, when the content of tin in an ITO target is high, that is, when the content of $SnO_2$ in ITO is high (for example, the content of $SnO_2$ in ITO is preferably not less than 4% by weight and not more than 20% by weight and, in the case of sputtering, more preferably 13% by weight), the migration-depositing of tin on the surface of the electrode is accelerated. Upon subsequent oxidation, for example, by oxygen plasma treatment, UV treatment, or ozone treatment, an $SnO_2$ layer can be formed on the outermost surface of the electrode to increase work function, and good interfacial electric connection between ITO and a hole transport layer can be realized.

Further, the work function can be increased by a method wherein, after the deposition of tin or antimony on a substrate, a thin-film ITO electrode is formed to migration-deposit tin or antimony on the surface of the thin-film electrode, and the above post-treatment is then carried out. The application of proper energy, such as heat, at the time of ITO thin film formation accelerates grain boundary diffusion and development of surfactant effect of tin or other metal having surfactant effect which permits tin to be migration-deposited on the outermost surface of the electrode. Subsequent proper post-treatment in the same manner as described above can increase the work function.

The content of $SnO_2$ in the ITO electrode according to the present invention is preferably 2 to 20% by weight. More preferably, when ITO is formed by sputtering, the content of $SnO_2$ in ITO is about 13% by weight; when ITO is formed by ion plating, the content of $SnO_2$ in ITO is about 8% by weight; and when ITO is formed by vapor deposition, the content of $SnO_2$ in ITO is about 15% by weight.

In the ITO electrode according to the present invention, preferably, the concentration of $SnO_2$ in the surface of the ITO electrode is higher than the concentration of $SnO_2$ within the ITO electrode.

Electroluminescent Device

The electrode for electroluminescence according to the present invention is preferably used as an anode and/or a cathode in an electroluminescent device, particularly an organic electroluminescent device. Preferably, the electroluminescent device comprises at least an anode, an electroluminescent layer provided on the anode, and a cathode provided on the electroluminescent layer. More preferably, the electroluminescent device comprises at least an anode, a hole transport layer provided on the anode, an electroluminescent layer provided on the hole transport layer, and a cathode provided on the electroluminescent layer.

For example, when the electrode for electroluminescence according to the present invention is used as an anode in an organic electroluminescent device, the work function of the surface of the anode can be enhanced at the interface between the anode and the hole transport layer to reduce the gap in work function between the surface of the anode and the hole transport layer. As a result, the efficiency of hole injection can be improved to improve luminescence characteristics of the organic electroluminescence. The luminescence characteristics of the organic electroluminescence can also be improved by forming a hole-rich material on the surface of the anode. On the other hand, in the case of use of the electrode for electroluminescence according to the present invention as the cathode in the organic electroluminescent device, the work function of the surface of the cathode is reduced, the electric characteristics of the connection interface are improved, and the efficiency of electron injection can be realized to improve luminescence characteristics of the organic electroluminescence.

Embodiments of electroluminescent devices using the electrode for electroluminescence according to the present invention will be described.

In an embodiment, an organic electroluminescent device has a device structure of substrate/X/ITO/hole transport layer/luminescent layer/cathode wherein X represents an additive element for an electrode, such as tin or antimony. In this electroluminescent device, after the formation of the X layer, the ITO layer is formed. In the formation of the ITO layer, proper energy is applied to accelerate the diffusion of X into the surface of ITO. Thereafter, proper post-treatment is carried out to control the work function, whereby good electrically connected interface between ITO (anode) and the hole transport layer can be realized.

In another embodiment, an organic electroluminescent device has a device structure of substrate/ITO/hole transport layer/luminescent layer/cathode. In this electroluminescent device, the optimization of the content of $SnO_2$ in an ITO target can control the content of tin in the surface of ITO, and subsequent proper post-treatment can control interfacial electric characteristics, such as work function, whereby good electrically connected interface between ITO (anode) and the hole transport layer can be realized.

In a further embodiment, an organic electroluminescent device has a device structure of substrate/X/cathode/luminescent layer/hole transport layer/ITO wherein X represents an additive element for an electrode, such as cerium (Ce) or rubidium (Rb). In this electroluminescent device, after the formation of the X layer, the cathode layer is formed. In the formation of the cathode, proper energy is applied to accelerate the diffusion of X into the surface of the cathode. Thereafter, proper post-treatment is carried out to control interfacial electric characteristics, such as work function, whereby good electrically connected interface between the cathode and the luminescent layer can be realized.

Interfacial Electric Characteristics

In the electrode for electroluminescence according to the present invention, interfacial electric characteristics, such as work function, can be controlled to a suitable value. The work function can be measured, for example, an UV photoelectron spectroscopic device (for example, AC-1, manufactured by RIKEN KEIKI CO., LTD) and affects photoelectric effect and the like.

EXAMPLES

Example 1

An about 10 nm-thick platinum (Pt) layer was formed by sputtering on a glass substrate. A 1,500 angstrom-thick ITO layer was then formed thereon by sputtering. At the time of the formation of the ITO layer, an attempt to diffuse platinum into the surface of the ITO layer was made by heating the substrate at about 250° C. As a result, migration-depositing of platinum on the surface of ITO was observed, and the work function value of the surface of the electrode was increased. Thereafter, a hole transport layer and a luminescent layer were formed by spin coating, and a 20 nm-thick calcium (Ca) electrode and a 2,000 angstrom-thick silver (Ag) electrode were formed by vapor deposition using a mask to prepare an organic electroluminescent device. This organic electroluminescent device was evaluated for luminescence characteristics and, as a result, was found to have improved brightness.

Example 2

An about 10 nm-thick antimony (Sb) layer was formed by sputtering on a glass substrate. A 1,500 angstrom-thick ITO layer was then formed thereon by sputtering. At the time of the formation of the ITO layer, an attempt to diffuse antimony into the surface of the ITO layer was made by heating the substrate at about 250° C. As a result, migration-depositing of antimony on the surface of ITO was observed. The assembly was then subjected to chlorine plasma treatment. Upon this treatment, it was confirmed that $SbCl_2$ was present on the surface of the assembly. Further, a hole transport layer and a luminescent layer were formed by spin coating, and a 20 nm-thick calcium electrode and a 2,000 angstrom-thick silver electrode were formed by vapor deposition using a mask to prepare an organic electroluminescent device. This organic electroluminescent device was evaluated for luminescence characteristics and, as a result, was found to have improved brightness.

Example 3

Tin (Sn) pieces were put on an $In_2O_3$ target, and sputtering was carried out on a glass substrate. In this case, the area of the tin pieces and the number of the tin pieces were controlled. Thus, a 1,500 angstrom-thick $In_2O_3$ layer having an $SnO_2$ content of 0% and 1,500 angstrom-thick ITO layers respectively having $SnO_2$ contents of 5%, 10%, 13%, and 20% were formed on the substrate. At the time of the formation of the ITO layers, the substrate was heated at about 250° C. to accelerate diffusion of tin into and segregation of tin on the surface of ITO. As a result, it was found that the level of segregation of tin on the surface of ITO was increased in increasing order of $SnO_2$ content, that is, in the following order: 5%, 10%, 13%, and 20%. Thereafter, oxygen plasma treatment or UV irradiation treatment (in air) was carried out. For both the treatments, the work function of the surface of the ITO was increased in increasing order of $SnO_2$ content, that is, in the following order: 5%, 10%, 13%, and 20%. Thereafter, a hole transport layer and a luminescent layer were formed by spin coating, and a 20 nm-thick calcium electrode and a 2,000 angstrom-thick silver electrode were formed by vapor deposition using a mask. The luminescence characteristics of the organic electroluminescent devices were evaluated. As a result, the organic electroluminescent device using the ITO layer having an $SnO_2$ content of 13% had the highest brightness. Accordingly, a sputtering target having such a composition that the value of $SnO_2/(In_2O_3+SnO_2)$ was 13% was prepared. A 1,500 angstrom-thick ITO layer was formed by sputtering at 250° C. using this target. The content of $SnO_2$ in the ITO layer was measured and found to be about 13%. In the same manner as described above, oxygen plasma treatment was carried out, and an organic electroluminescent device was then prepared using the electrode thus obtained. The organic electroluminescent device was found to have improved luminescence brightness over a conventional organic electroluminescent device having such a sputtering target composition that the value of $SnO_2/(In_2O_3+SnO_2)$ was 10%. The same experiment as described above was carried out except that the ITO layer was formed by ion plating or vapor deposition instead of sputtering. As a result, for the organic electroluminescent devices thus obtained, the maximum luminescence brightness was obtained in such a material composition that the value of $SnO_2/(In_2O_3+SnO_2)$ was 8% for the ion plating and in such a material composition that the value of $SnO_2/(In_2O_3+SnO_2)$ was 15% for the vapor deposition.

As is apparent from the foregoing description, according to the present invention, the surface electric characteristics of the electrode for electroluminescence can be improved. When the electrode for electroluminescence according to the present invention is used in an organic electroluminescent device, increased luminescence efficiency of the organic electroluminescent device can be realized. Further, when ITO is used in an electrode for electroluminescence, increasing the content of $SnO_2$ in the surface of the electrode can be also expected to attain such an effect that the acid resistance of the electrode can be improved, the diffusion of impurity ions contained in an ITO electrode or a glass substrate can be suppressed, and, thus, the characteristics of the electrode can be improved.

What is claimed is:

1. An electrode for electroluminescence comprising an electrode additive element, wherein:

the electrode additive element is present in an interior region of the electrode and in a surface region of the electrode; and a first concentration of the electrode additive element in the surface region of the electrode is higher than a second concentration of the additive element in the interior region of the electrode.

2. The electrode for electroluminescence according to claim 1, wherein:

the electrode is an anode;

a layer is provided on the anode; and the layer has a larger work function than the anode.

3. The electrode for electroluminescence according to claim 2, wherein:

the anode is an ITO electrode; and the electrode additive element is $SnO_2$.

4. The electrode for electroluminescence according to claim 1, wherein:

the electrode is a cathode;

a layer is provided on the cathode; and the layer has a smaller work function than the cathode.

5. An electroluminescent device comprising the electrode for electroluminescence according to claim 1.

* * * * *